United States Patent
Ou et al.

(10) Patent No.: US 8,256,658 B2
(45) Date of Patent: Sep. 4, 2012

(54) WIRE BONDING APPARATUS COMPRISING ROTARY POSITIONING STAGE

(75) Inventors: Gang Ou, Singapore (CN); Ajit Gaunekar, Singapore (CN); Dongsheng Zhang, Singapore (CN); Ka Shing Kenny Kwan, Singapore (CN)

(73) Assignee: ASM Technology Singapore Pte Ltd, Singapore (SG)

( * ) Notice: Subject to any disclaimer, the term of this patent is extended or adjusted under 35 U.S.C. 154(b) by 782 days.

(21) Appl. No.: 11/840,005

(22) Filed: Aug. 16, 2007

(65) Prior Publication Data

US 2009/0045244 A1  Feb. 19, 2009

(51) Int. Cl.
*B23K 37/00* (2006.01)
*B23K 31/00* (2006.01)
(52) U.S. Cl. ......................... 228/4.5; 228/4.1; 228/180.5
(58) Field of Classification Search ......................... None
See application file for complete search history.

(56) References Cited

U.S. PATENT DOCUMENTS

| | | | |
|---|---|---|---|
| 6,460,751 B1 | 10/2002 | Thurlemann | 228/4.5 |
| 7,025,243 B2 | 4/2006 | Wong | 228/4.5 |
| 2004/0129754 A1* | 7/2004 | Suresh et al. | 228/4.5 |

* cited by examiner

*Primary Examiner* — Jessica L Ward
*Assistant Examiner* — Steven Ha
(74) *Attorney, Agent, or Firm* — Ostrolenk Faber LLP

(57) ABSTRACT

A wire bonding apparatus, comprising a bonding tool mounted on a bondhead body which is in turn mounted on a positioning table, is provided for bonding electronic devices. The positioning table has first and second motors coupled to it that are operative to drive the bondhead body to positions along respective first and second orthogonal axes. The bondhead body is connected to the positioning table through a pivot such that the bondhead body is rotatable relative to the positioning table about a third axis which is substantially orthogonal to the first and second axes. Further, a third motor drives the bondhead body to rotate about the third axis.

9 Claims, 4 Drawing Sheets

WIRE BONDING APPARATUS COMPRISING ROTARY POSITIONING STAGE

FIELD OF THE INVENTION

The invention relates to wire bonders, and in particular to a bondhead for wire bonders that make electrical wire connections on electronic devices.

BACKGROUND AND PRIOR ART

Current wire bonders typically have bondheads comprising rocker arms that rotate a bonding tool up and down about a horizontal axis with a small angular stroke. The angular stroke of the rocker arm positions the bonding tool along a vertical Z-axis. The bondhead is mounted on mutually orthogonal X and Y motion stages of an XY table in order to position the bonding tool in the X and Y axes on a horizontal plane.

The said Z-axis motion of the bonding tool is usually driven by a direct drive motor, such as a voice coil motor. For instance, U.S. Pat. No. 7,025,243 entitled "Bondhead for Wire Bonding Apparatus" discloses a bonding tool held by a bondhead body, which is driven by a bondhead actuator to rotate in order to position the bonding tool with respect to a bonding surface.

FIG. 1 is a side view of a prior art wire bonder bondhead that is mounted on an XY table. The wire bonder generally comprises a bondhead body 10 to which a bonding tool such as an ultrasonic transducer 12 is mounted for generating ultrasonic bonding energy. The bondhead body 10 is enclosed in a bondhead housing 14 and it is rotatably positioned on a pivot, such as a flexure bearing 16, to create the aforesaid rocker arm mechanism. The bondhead body 10 and ultrasonic transducer 12 are drivable to rotate about the X-axis by a direct drive actuator such as a voice coil motor 18. A wire clamp 20 is located over the ultrasonic transducer 12 for feeding bonding wire 22 to a capillary 24 at a tip of the ultrasonic transducer 12. The capillary 24 attaches the bonding wire 22 to bonding surfaces of a die 26, and a carrier 28 on which the die 26 is mounted.

The base of the bondhead housing 14 is mounted on an XY table 30, which comprises an X-stage to linearly drive the bondhead body along an X-axis and a Y-stage to linearly drive the bondhead body 10 along a Y-axis. The X and Y stages of the XY table are separately driven by direct drive motors called linear motors. The various stages for driving X, Y and Z motion of the bonding tool are preferably equipped with suitably mounted encoders which provide very high resolution position feedback for closed loop control of the bonding tool to ensure bonding accuracy at the tip of the capillary 24.

The speed of wire bonding machines has increased year by year. This has resulted in higher force (and power) requirements from the direct drive motors. Since one stage (typically the X-stage) carries the other stage (typically the Y-stage) which in turn carries the bondhead including the Z-stage, it is the X-stage which has to move the largest mass at high accelerations. This makes the X-motor the bulkiest component and also results in large amounts of heat being dissipated by the X-motor during wire bonding operations. The resulting high temperature tends to reduce the reliability of the X-motor. Also, the heat generated needs elaborate cooling arrangements to prevent it from migrating to the bonding area, which may affect the accuracy of bonding operations.

Due to higher speeds of the XY table, which in turn require higher accelerations, the vibrations generated by motion of the moving mass have also increased considerably. These vibrations are transmitted to the work-holder which holds the substrate or carrier being bonded, thus adversely affecting bond-placement accuracy on the same. Since the X-stage has to move the largest mass, the vibrations created by the X-stage have the highest magnitude.

Another observation is that the linear bearings of the X-stage are the worst stressed, due to high preloading for high stiffness and also due to the high moment loading resulting from the offset between an actuating X-force and the shifting centre of gravity of the mass carried on it that is moving in the Y-direction.

With a view to overcoming some of the above problems, U.S. Pat. No. 6,460,751 entitled "Bondhead for a Wire Bonder" describes a wire bonding apparatus in which the linear X-stage has been altogether eliminated. Instead a rocker-arm rotary stage is mounted on a vertical axis rotary stage. The rotary stage uses air bearings and is driven by a direct drive motor. The rotary stage, with a vertical rotary axis, is mounted onto the linear Y-stage. Such a rotary stage in effect replaces the X-stage but does not impart purely linear motion in the X-direction to the bonding tool. Since the motion of the bonding tool is rotary, it has an X-direction component as well as a Y-direction component. The Y-direction component can be compensated for by the linear Y-motion imparted by the Y-stage.

Although this design is meant to solve the aforementioned problems associated with the conventional X-stage, it has its own limitations. Firstly, since the total angular travel range is relatively large (+/−15 degrees), the force that is required of the direct drive motor—although less than the purely linear X-stage that it replaces—is still quite substantial with the result that the direct drive motor cannot be made very small and compact. Furthermore, use of air bearings places very high demands on the precision of the manufactured parts and their assembly. It also takes up quite considerable space. Being relatively heavy, it increases the loading on the Y-stage which may then begin to face problems similar to the ones mentioned above for the X-stage. Air-bearings also consume copious amount of compressed air even when the bonder is not bonding, thus adding to the running costs.

SUMMARY OF THE INVENTION

It is thus an object of the invention to seek to provide a wire bonding apparatus that allows the bonding tool of the wire bonding apparatus to achieve high acceleration over relatively small distances more efficiently, while maintaining compactness and avoiding some of the aforesaid shortcomings of the prior art.

According to a first aspect of the invention, there is provided a wire bonding apparatus for an electronic device, comprising: a bonding tool mounted on a bondhead body; a positioning table on which the bondhead body is mounted, the positioning table having first and second motors coupled to it that are operative to drive the bondhead body to positions along respective first and second orthogonal axes; a pivot connecting the bondhead body to the positioning table such that the bondhead body is rotatable relative to the positioning table about a third axis which is substantially orthogonal to the first and second axes; and a third motor operative to drive the bondhead body to rotate about the third axis.

According to a second aspect of the invention, there is provided a method of wire bonding an electronic device, comprising the steps of: providing a positioning table having first and second motors coupled to it; driving a bondhead body mounted onto the positioning table to a position along first and second orthogonal axes with the first and second motors respectively; rotating the bondhead body with a bonding tool connected to it about a third axis which is substantially orthogonal to the first and second axes with a third motor so as to position the bonding tool at a first bonding point; making a first wire bond at the first bonding point; rotating the bondhead body about the third axis to position the bonding tool at a second bonding point; and thereafter making a second wire bond at the second bonding point to form a wire connection between the first and second bonding points.

It will be convenient to hereinafter describe the invention in greater detail by reference to the accompanying drawings, which illustrate one embodiment of the invention. The particularity of the drawings and the related description is not to be understood as superseding the generality of the broad identification of the invention as defined by the claims.

BRIEF DESCRIPTION OF THE DRAWINGS

An example of a preferred embodiment of a wire bonding apparatus in accordance with the invention will now be described with reference to the accompanying drawings, in which.

DETAILED DESCRIPTION OF THE DETAILED EMBODIMENTS OF THE INVENTION

Figure 2:
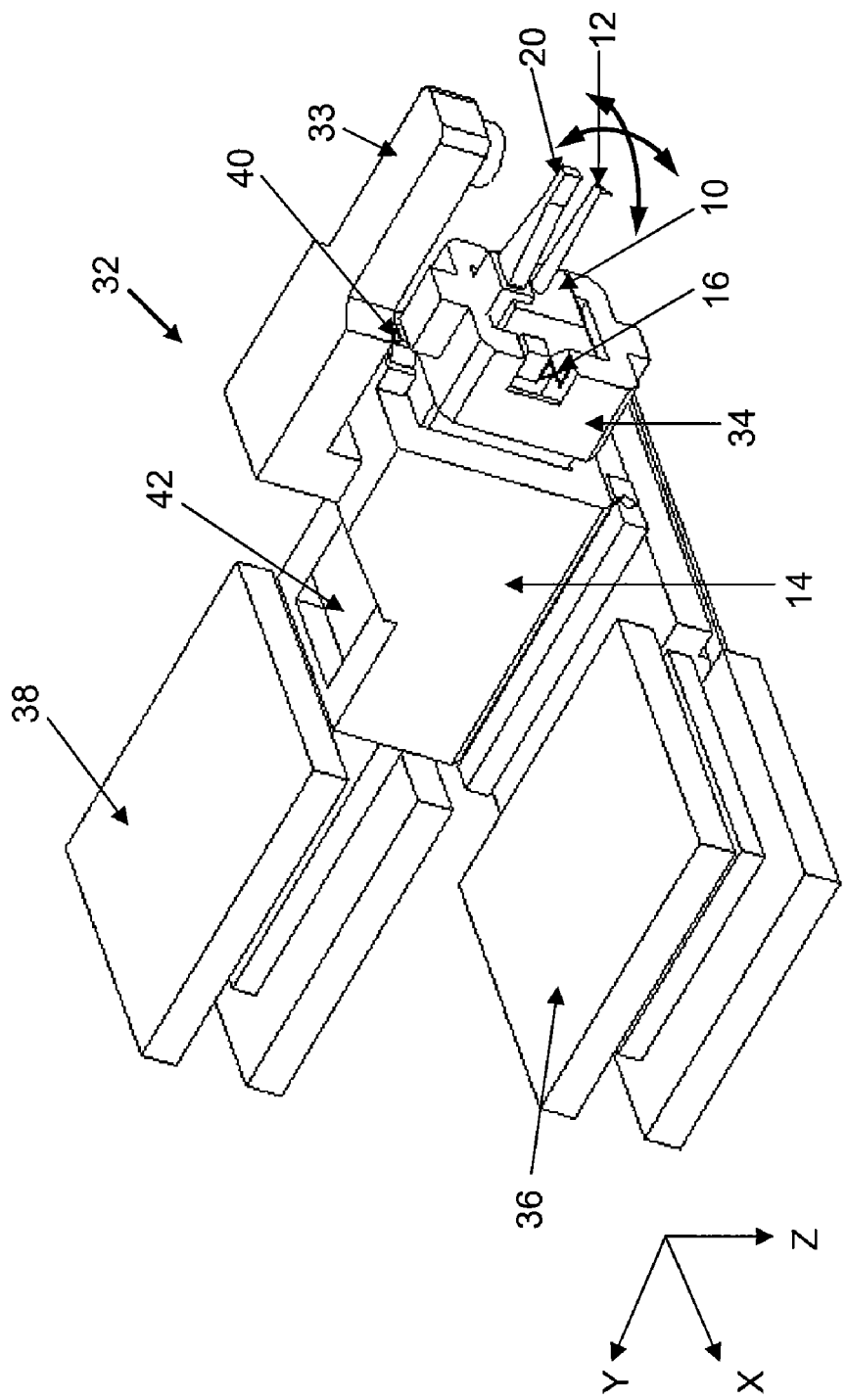
FIG. 2 is an isometric view of a wire bonding apparatus according to the preferred embodiment of the invention.

FIG. 2 is an isometric view of a wire bonding apparatus 32 according to the preferred embodiment of the invention. The wire bonding apparatus 32 includes an optical system 33 located at the top of the apparatus to view a bonding position. A bonding tool in the form of the ultrasonic transducer 12 is mounted on the bondhead body 10. The bondhead body 10 of the bondhead as previously described is contained in a support structure 34 and is pivotally movable on an X flexure bearing 16 that is located between the bondhead body 10 and the support structure 34. Hence, the bondhead body 10 is rotatable relative to the support structure 34. The bondhead body 10 and support structure 34 are mounted on a positioning table in the form of the XY table 30. The XY table 30 further comprises a first motor (such as X-motor 36) and a second motor (such as Y-motor 38) coupled to it to drive the bondhead body 10 to positions along respective first and second orthogonal XY axes.

The support structure 34 containing the bondhead body 10 is further connected to the bondhead housing 14 via a pivot, preferably a Z flexure bearing 40, such that the support structure 34 is pivotally rotatable about a third axis (for instance the Z-axis) which is substantially orthogonal to the first and second axes in order to position the capillary 24 over relatively small distances along a horizontal XY plane as compared to the X-motor 36. The support structure 34 and bondhead body 10 that are so pivoted are drivable to rotate about the Z-axis by a third motor, such as theta motor 42, which preferably comprises a voice coil motor. Accordingly, the X-motor 36 is used to drive the ultrasonic transducer 12 over relatively larger distances in the X-axis, such as between different dice 26 mounted on a carrier 28 or between portions of a large sized die. For driving the ultrasonic transducer 12 over relatively smaller distances in the X-axis, such as between different connection pads when connecting a length of wire, the theta motor 42 may be used instead.

Figure 3:
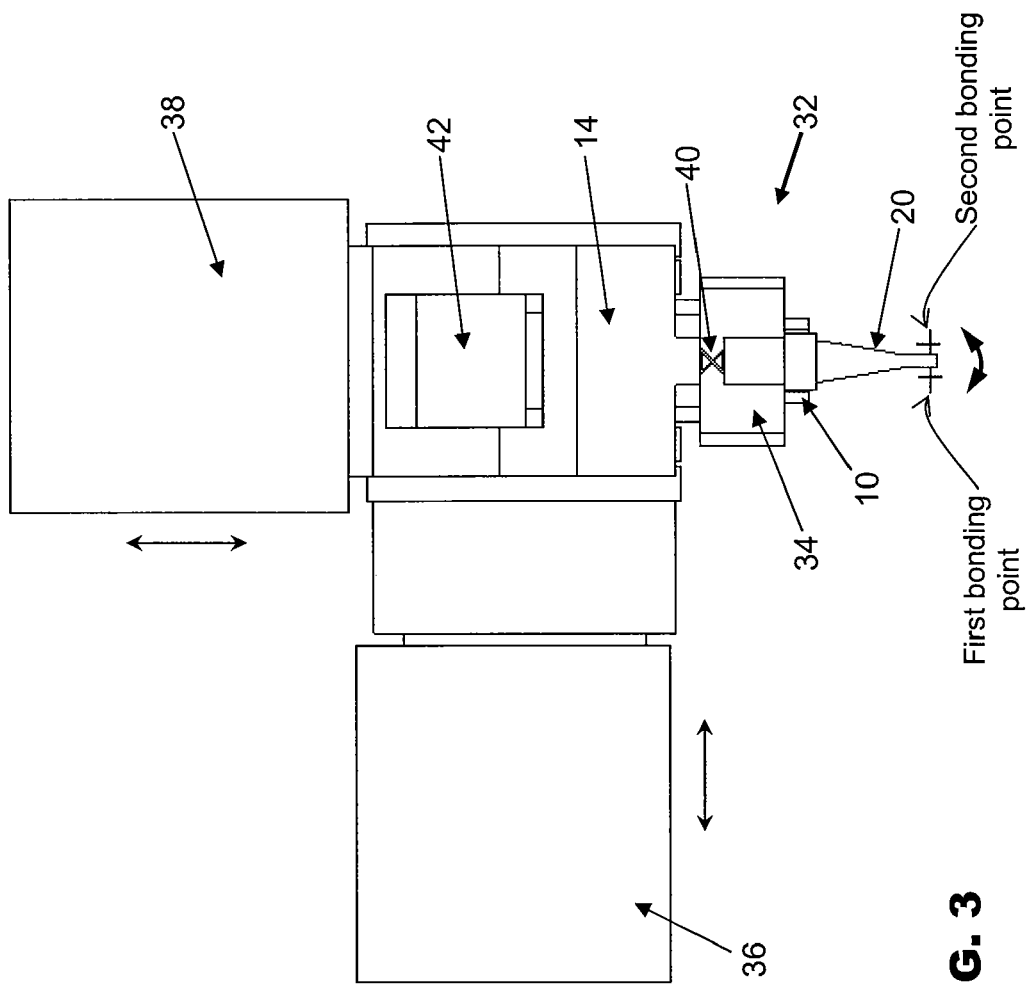
FIG. 3 is a plan view of the wire bonding apparatus illustrated in FIG. 2.

FIG. 3 is a plan view of the wire bonding apparatus 32 illustrated in FIG. 2, with the optical system 33 removed for clarity. This view illustrates that the support structure 34 containing the bondhead body 10 is pivotally connected to the bondhead housing 14 through the Z flexure bearing 40. The theta motor 42 drives a horizontal rocker arm assembly comprising the support structure 34, the bondhead body 10, ultrasonic transducer 12 and capillary 24 to rotate on a horizontal plane about the Z-axis over a relatively shorter distance. On the other hand, the X-motor 36 drives the components in the X-axis and the Y-motor drives the components in the Y-axis on the horizontal plane over relatively larger distances.

The horizontal rocker arm assembly is mounted on a vertical axis rotary stage with a small range of angular travel of about +/−2.5°, whereby the theta motor 42 is preferably operative to drive angular travel of the bonding tool by no more than 5°. Based upon a typical length of an ultrasonic transducer 12, this translates to about +/−5 mm as the X-component of the arc motion of the ultrasonic transducer 12 in the horizontal plane at its tip where the capillary 24 is located. Accordingly, the maximum travel distance of a bonding tip of the ultrasonic transducer 12 where the capillary 24 is located is preferably not more than 10 mm. The small Y-component of the arc motion may be compensated for by the Y-stage driven by the Y-motor 38.

It would be appreciated from the above description that the linear X-stage is retained but its duty is now substantially reduced as it needs to move at a reduced velocity and acceleration since the high speed X-motion component during wire bonding is provided by the compact and light-weight vertical axis rotary stage. Thus, in an exemplary operation, the rotary Z-stage positions the capillary 24 of the ultrasonic transducer 12 at a first bonding point to make a first wire bond, and then rotates the ultrasonic transducer 12 about the Z-axis to position the capillary 24 at a second bonding point to make a second wire bond and to form a wire bond between the first and second bonding points. On the other hand, the X-stage needs to largely perform an indexing type of motion to carry the Y-Theta-Z assembly as required by the X-dimension of the package being bonded, over the entire X travel range, which places lesser demands on speed and acceleration. In this way, the X-stage can also be made compact and generates less heat during wire bonding operations.

Figure 1:
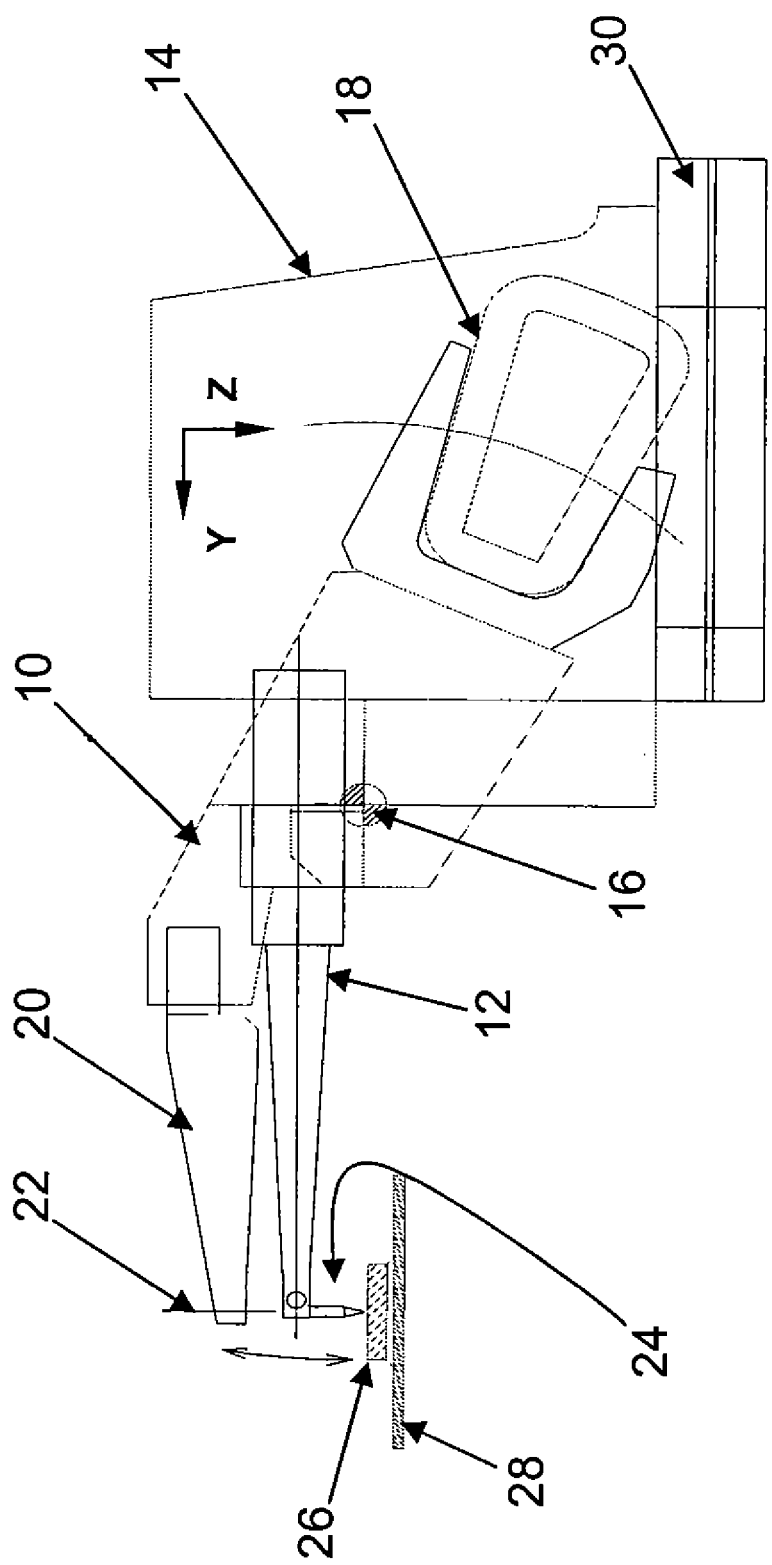
FIG. 1 is a side view of a prior art wire bonder bondhead that is mounted on an XY table.
Figure 4:
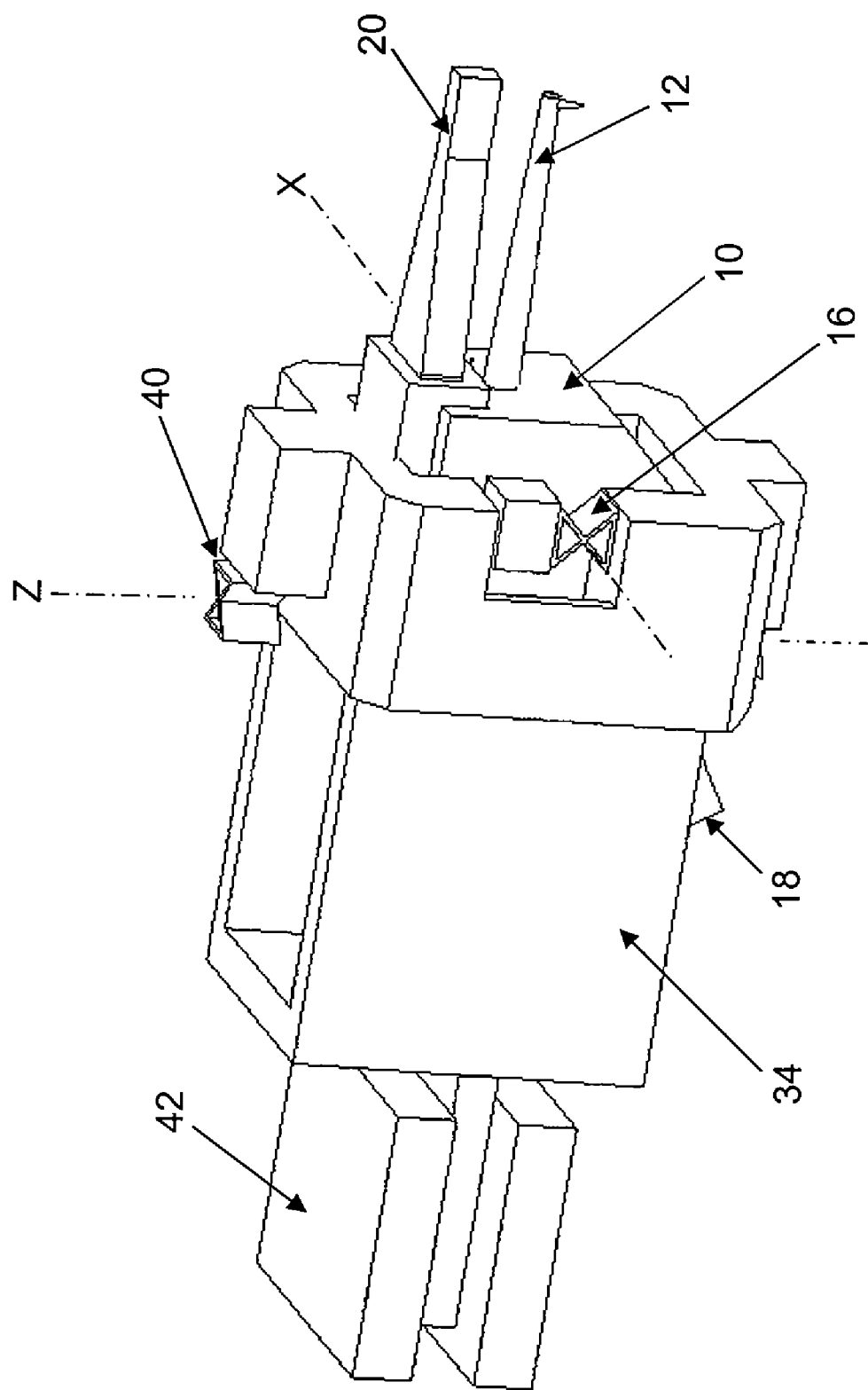
FIG. 4 is an isometric view of the bondhead of the wire bonding apparatus according to the preferred embodiment of the invention.

FIG. 4 is an isometric view of the bondhead of the wire bonding apparatus 32 according to the preferred embodiment of the invention. It illustrates that the support structure 34 is driven to rotate about the Z-axis by the theta motor 42 via the Z flexure bearing 40. On the other hand, the bondhead body 10 is driven to rotate about the X-axis by a fourth motor, such as the voice coil motor 18 (see FIG. 1). The voice coil motor 18 is preferably situated primarily inside the support structure 34 so that it is at least partially enclosed by the support structure 34. Rotary or rocking motion of the bondhead body 10 relative to the support structure 34 takes place about the X-axis via another pivot (such as the X flexure bearing 16) connecting the bondhead body 10 to the support structure 34.

It should be appreciated that in today's wire bonding applications, although the wire bonding area is increasing all the time, the wire lengths of wire connections are still typically less than 10 mm for most applications. To use a large motor to drive the motion part to bond such short wires that require short motion distances is inefficient in terms of motion time and energy expended. The preferred embodiment of the invention thus uses the larger XY table 30 to carry the bondhead body 10 to the locations where the wires are bonded, and uses mainly the compact theta motor 42 for moving the ultrasonic transducer 12 in the X-axis during the actual wire bonding. Since the angle of rotation of the vertical axis rotary stage driven by the theta motor 42 is small, it affords the use of simple and compact flexure-pivots, thus avoiding the complexity and associated high costs of air bearings. Since the flexure-pivot is very compact, the entire theta-stage can be made relatively lightweight and with a low moment of inertia about the vertical rotation axis. Thus, the torque requirement for this stage is relatively small. The advantage is that a small direct drive motor such as a voice coil motor almost identical to that of the conventional rocker-arm voice coil motor 18 can be used. This leads to further cost savings.

Furthermore, the lightweight vertical axis rotation stage (along with the Y-stage) can also be effectively used for "scrubbing" motion by generating rotary motion of the ultrasonic transducer 12 about the Z-axis. Scrubbing refers to a very low amplitude (~10-12 microns), low frequency (~100-120 Hz) X-Y motion of the bonding tool immediately after touchdown on a bonding surface of a substrate, used just before the ball bond is completed on the bonding surface of the first wire bond. This action helps to promote the formation of a stronger bond between the wire and the bonding surface.

The invention described herein is susceptible to variations, modifications and/or additions other than those specifically described and it is to be understood that the invention includes all such variations, modifications and/or additions which fall within the spirit and scope of the above description.

The invention claimed is:

1. A wire bonding apparatus for bonding an electrical connection on an electronic device, the wire bonding apparatus comprising:
   a bondhead body and a bonding tool mounted on the bondhead body;
   a positioning table on which the bondhead body is mounted, the positioning table comprising a first motor and a second motor;
   the first motor and the second motor coupled to the positioning table and configured to drive the bondhead body to positions along, respectively, an x axis and y axis orthogonal to the x axis;
   a bondhead housing positioned on the positioning table;
   a support structure positioned and configured to at least partially enclose the bondhead body, the bondhead body being configured to rotate with respect to the support structure about the x axis in a plane that includes the y axis and a z axis;
   a pivot positioned and configured to connect the support structure to the bondhead housing such that the support structure is rotatable about the pivot; and
   a third motor connected to the support structure and operable to drive the support structure and the bondhead body to rotate about the pivot in a plane that includes the x axis and the y axis;
   wherein the support structure and the third motor are mounted on the positioning table.

2. The wire bonding apparatus as claimed in claim 1, further comprising a support structure containing the bondhead body, and the pivot is attached to the support structure.

3. The wire bonding apparatus as claimed in claim 2, further comprising a second pivot connecting the bondhead body to the support structure such that the bondhead body is rotatable relative to the support structure about the x axis or the y axis.

4. The wire bonding apparatus as claimed in claim 3, further comprising a fourth motor configured to drive the bondhead body to rotate about the x axis or the y axis, wherein the fourth motor is at least partially enclosed by the support structure.

5. The wire bonding apparatus as claimed in claim 1, wherein the pivot comprises a flexure bearing.

6. The wire bonding apparatus as claimed in claim 1, wherein the third motor comprises a voice coil motor.

7. The wire bonding apparatus as claimed in claim 1, wherein the third motor is configured to displace the bondhead body over smaller distances than the first motor and than the second motor.

8. The wire bonding apparatus as claimed in claim 7, wherein the third motor is configured to drive the bonding tool for angular travel of at most 5°.

9. The wire bonding apparatus as claimed in claim 7, wherein the bonding tool comprises a bonding tip positioned at a capillary, wherein the third motor is configured to drive the bonding tip of the bonding tool a maximum travel distance of at most 10 mm along the x axis or the y axis.

* * * * *